United States Patent

[11] 3,609,476

[72] Inventor Herbert F. Storm
Delmar, N.Y.

[21] Appl. No. 50,228
[22] Filed June 26, 1970
[45] Patented Sept. 28, 1971
[73] Assignee General Electric Company

[54] INTERDIGITATED STRUCTURES FOR GATE TURNOFF THYRISTORS AND FOR TRANSISTORS
15 Claims, 10 Drawing Figs.

[52] U.S. Cl. .......... 317/235 R, 317/234 R, 317/234 N, 317/235 AB, 317/235 AK
[51] Int. Cl. .......... H01l 5/00, H01l 11/00
[50] Field of Search .......... 317/234 (5.4), 234 (41.1), 234 (47.1)

[56] References Cited

UNITED STATES PATENTS

| | | | |
|---|---|---|---|
| 3,368,123 | 2/1968 | Rittmann | 317/235 |
| 3,309,585 | 3/1967 | Forrest | 317/234 |
| 3,356,862 | 12/1967 | Diebold et al. | 307/88.5 |
| 3,474,303 | 10/1969 | Lutz | 317/234 |

*Primary Examiner*—John W. Huckert
*Assistant Examiner*—B. Estrin
*Attorneys*—John F. Ahern, Paul A. Frank, Julius J. Zaskalicky, Donald R. Campbell, Frank L. Neuhauser, Oscar B. Waddell and Joseph B. Forman

ABSTRACT: An interdigitated emitter-base (or emitter-gate) layer structure is formed in the shape of an involute on a circular wafer. Because of greater wafer utilization, higher power ratings in semiconductor devices are realized. The contours of the involute-shaped interdigitated emitter and base contact elements are identical, simplifying mask preparation, and assuring simultaneous turnoff of the entire junction area in a gate turnoff thyristor, and simultaneous turn on in a transistor.

Inventor:
Herbert F. Storm,
by Donald R. Campbell
His Attorney.

Inventor:
Herbert F. Storm,
by Donald R. Campbell
His Attorney.

Inventor:
Herbert F. Storm,
by Donald R. Campbell
His Attorney.

Inventor:
Herbert F. Storm,
by Donald R. Campbell
His Attorney.

INTERDIGITATED STRUCTURES FOR GATE TURNOFF THYRISTORS AND FOR TRANSISTORS

This invention relates to the geometry of interdigitated structures for semiconductor devices such as the gate turnoff thyristor and the transistor that are rendered nonconductive by the presence or absence of a control current at a control electrode. More particularly, the invention relates to emitter-base structures interdigitated in the form of an involute to provide higher power utilization and higher frequency capability in solid-state devices.

The gate turnoff silicon controlled rectifier is a four layer semiconductor device similar to the ordinary thyristor in that it is triggered into conduction by a gate current pulse applied to the gate electrode. Unlike the ordinary thyristor, however, the flow of load current through a gate turnoff thyristor is turned off by an opposite polarity current pulse applied to the gate, thus eliminating the need for special commutation components that add to the space requirements, cost, and complexity of ordinary thyristor circuits. Because of the shorter turnoff time, another advantage often overlooked is a higher frequency capability. Despite these desirable features, the gate turnoff thyristor, which is also known as the GTO switch or GTO-SCR, has not enjoyed wide usage primarily for the reason that available devices are low power devices with a load current capacity of no more than a few amperes. The problem is that at higher cathode currents the gate electrode is incapable of performing turnoff. In order to interrupt current flow in a thyristor by gate control, the entire area of the central junction between the two inner semiconductor layers must be turned off at the same time. If some portion of the junction area is turned off first, the load current concentrates in the remaining portions and increases the current density and temperature of these remaining portions, thereby making it more difficult or impossible to achieve complete turnoff. In considering the design of a higher power gate turnoff thyristor, then, the key problem is the removal of the excess carriers from the entire cross section of the junction area, and to achieve this removal with only a few volts of gate voltage. Larger gate turnoff thyristors have expected utility in the field of power electronics, as for instance in inverters, cycloconverters, radar pulsers, and power factor correctors.

As is well known, the transistor has a three layer semiconductor structure and is switched from the nonconducting state to the conducting state and maintained in the conducting state by supplying a control current to the base layer. In contrast to the gate turnoff thyristor, where the problem is in turning it off, there is no problem in turning off a power transistor, but there is difficulty in achieving complete turn on of the entire cross section of the conduction area. Although the transistor is operative with only a portion of the conduction area conducting, say 50 percent, the efficiency is reduced correspondingly. Using the power levels of the common power silicon controlled rectifier as a reference, the transistor is most frequently employed as a low-power device. The desirability of higher power transistors is believed to be obvious.

In larger gate turnoff thyristors, interdigitation of the emitter-gate area is necessary, and the same considerations are pertinent to an interdigitated emitter-base construction for a power transistor. If the individual emitter and gate or base elements are arranged in parallel stripes with dimensions such that the lateral resistance of the gate or base is uniform and small, then simultaneous turnoff of all elements of the junction area is obtained with low gate power. A rectangular interdigitation pattern on a round semiconductor wafer, however, results in waste space at the edges of the wafer. The loss in available junction area due to the waste space therefore is a limitation on the current rating. A rectilinear arrangement on a circular wafer, then is not a suitable design for a higher power device.

Accordingly, an object of the invention is higher power controlled turn on and turnoff solid-state switches, such as the gate turnoff thyristor and the transistor, incorporating improved interdigitated structures that make maximum or optimum use of a circular semiconductor wafer.

Another object is to provide interdigitated emitter-base structures with an involute geometry for use in power semiconductor devices to improve the power rating and high-frequency capabilities.

Yet another object is the provision of power gate turnoff thyristors and power transistors employing interdigitated configurations of the foregoing type, wherein such devices are controlled by low gate or base voltages.

In accordance with the invention, an improved interdigitated structure is provided in a multilayer semiconductor device of the type having outer layers and at least one inner layer connected to a control current terminal to control turnoff or turn on of the device. On a circular inner (or base) semiconductor layer of one conductivity type are formed a plurality of elongated interdigitated outer semiconductor layer (or emitter) elements of the opposite conductivity type and control current contact (or base contact) elements respectively having constant widths. All of these elements are involute shaped and formed parallel to one another on one surface of the inner semiconductor layer. Contact means effect parallel electrical connection of the involute-shaped outer semiconductor layer elements and independent parallel electrical connection of the control current contact elements. The evolute of the involute curves defining the elements is preferably a circle, and the last-mentioned contact means is formed on the inner semiconductor layer within the evolute circle, or as a ring-shaped contact at the periphery of the wafer or intermediate the evolute and periphery. The involutes can, if desired, be oppositely sloped. The involute configuration facilitates simultaneous turnoff and turn on of all portions of the junction area in a gate turnoff thyristor and in a transistor, and allows higher power ratings by utilizing more of the wafer area.

The foregoing and other objects, features, and advantages of the invention will be apparent from the following more particular description of several preferred embodiments of the invention, as illustrated in the accompanying drawings wherein.

Figure 1:
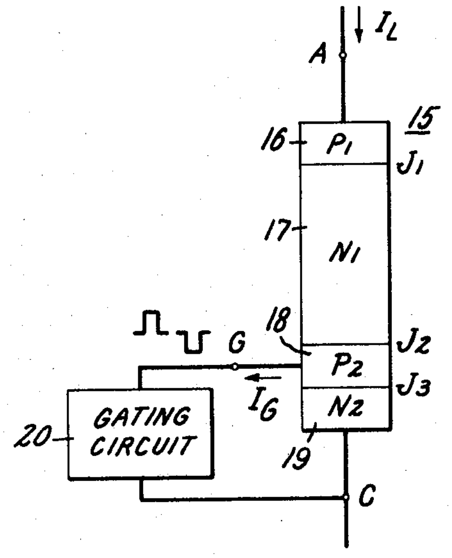
FIG. 1 is a schematic diagram of a PNPN gate turnoff thyristor useful in explaining the principles of such devices.
Figures 4, 5:
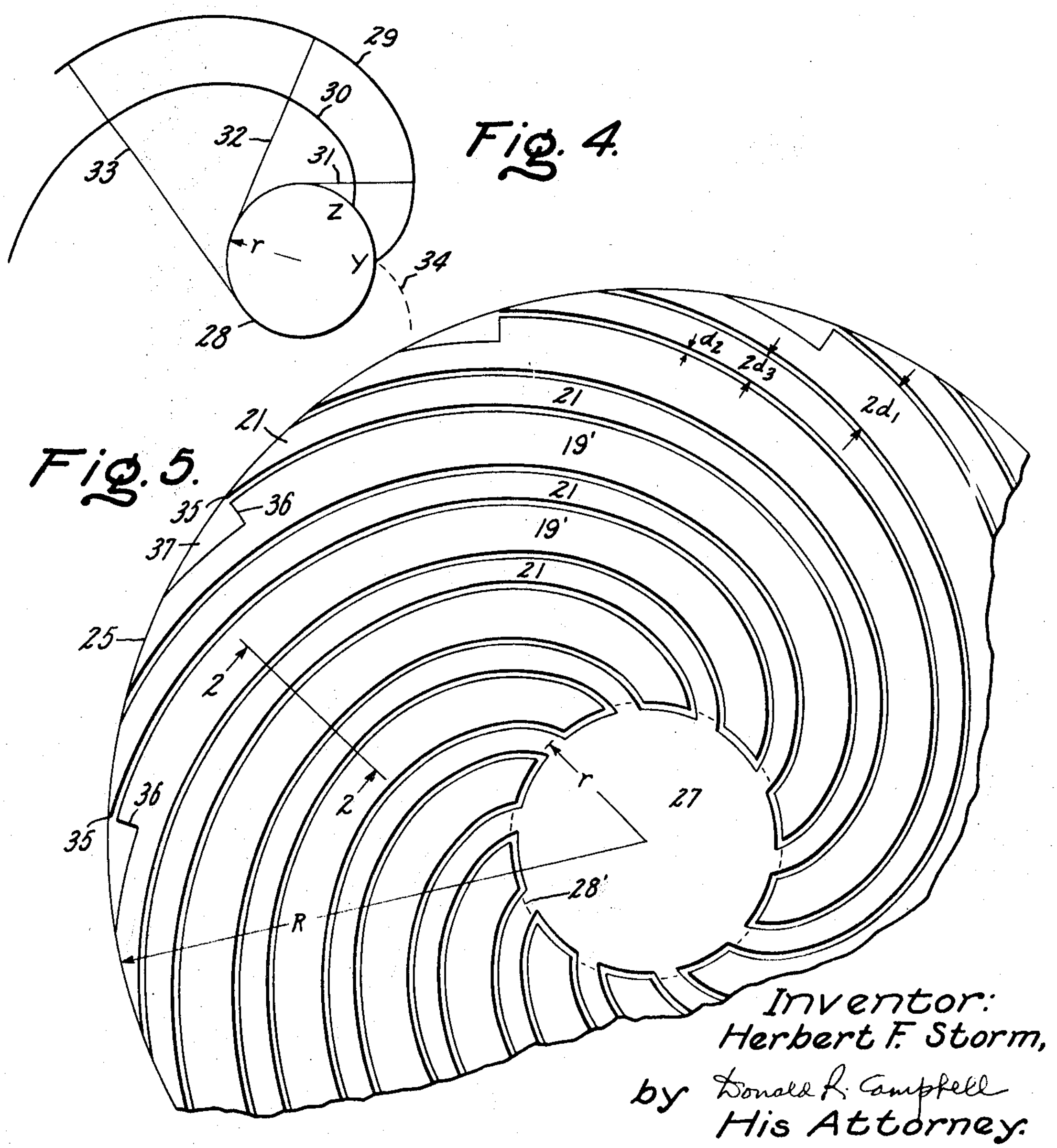
FIG. 4 is a sketch depicting the geometry of drawing an involute of a circle.
FIG. 5 is a partial plan view of the preferred embodiment of the emitter-gate interdigitation in the form of an involute of a circle on a circular semiconductor wafer.
Figure 6:
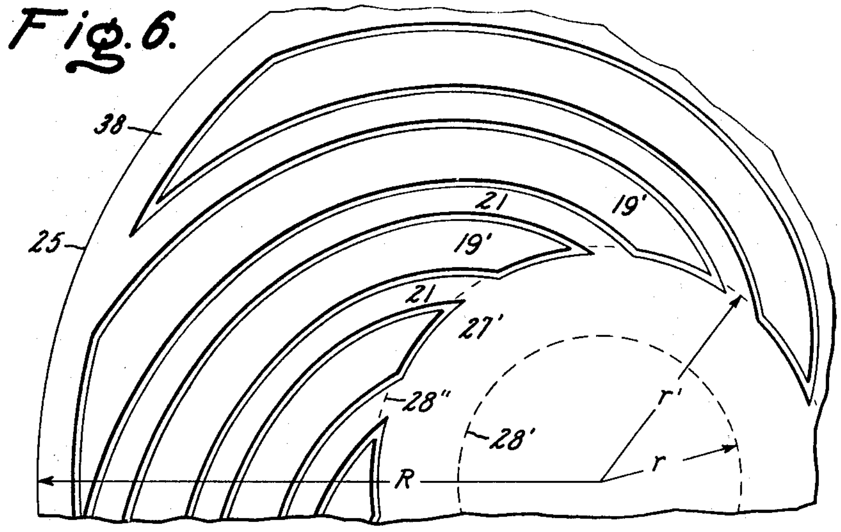
Figure 7:
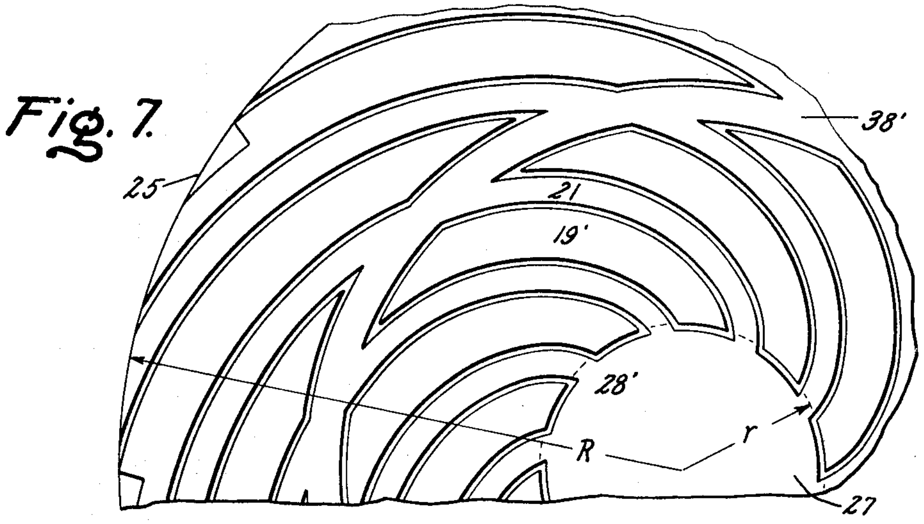
Figure 8:
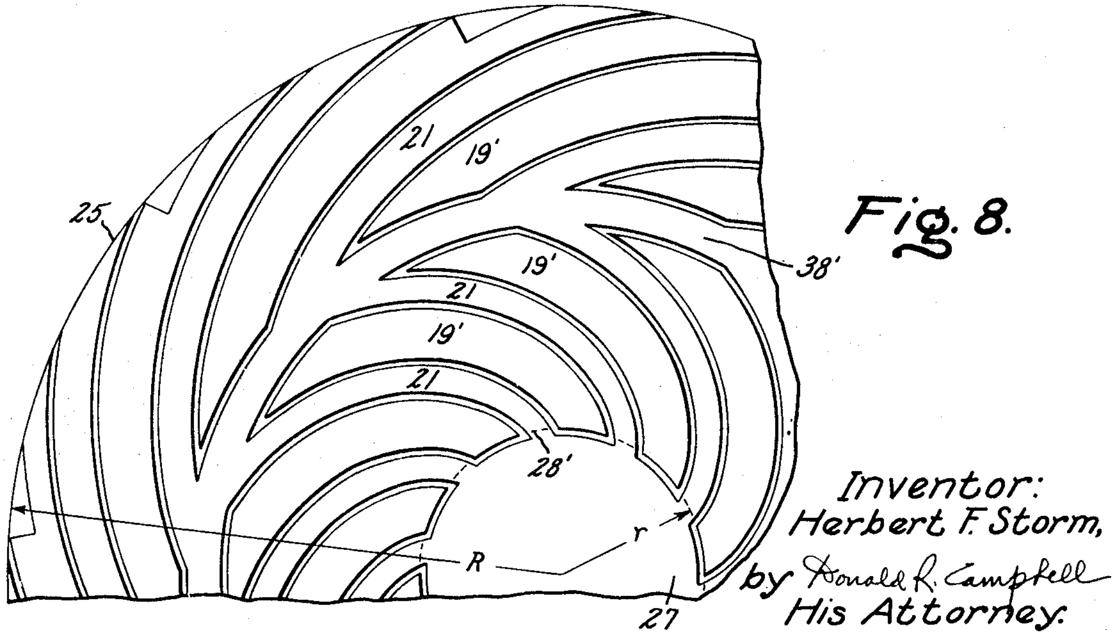
Figure 9:
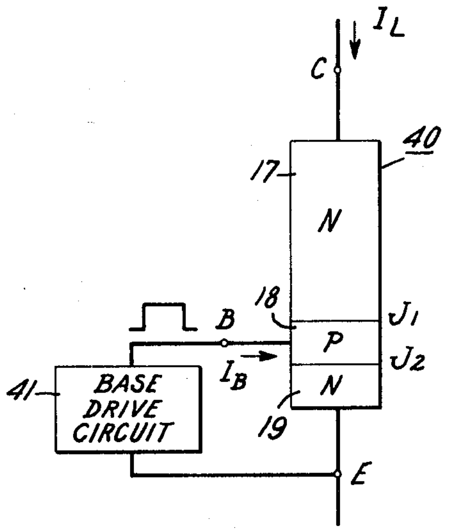

FIGS. 6, 7, and 8 are modifications of the preferred embodiment of FIG. 5 illustrating partial plan views of other involute interdigitation arrangements for practicing the invention;

FIG. 9 is a schematic diagram similar to FIG. 1 of an NPN power transistor; and

Figure 2:
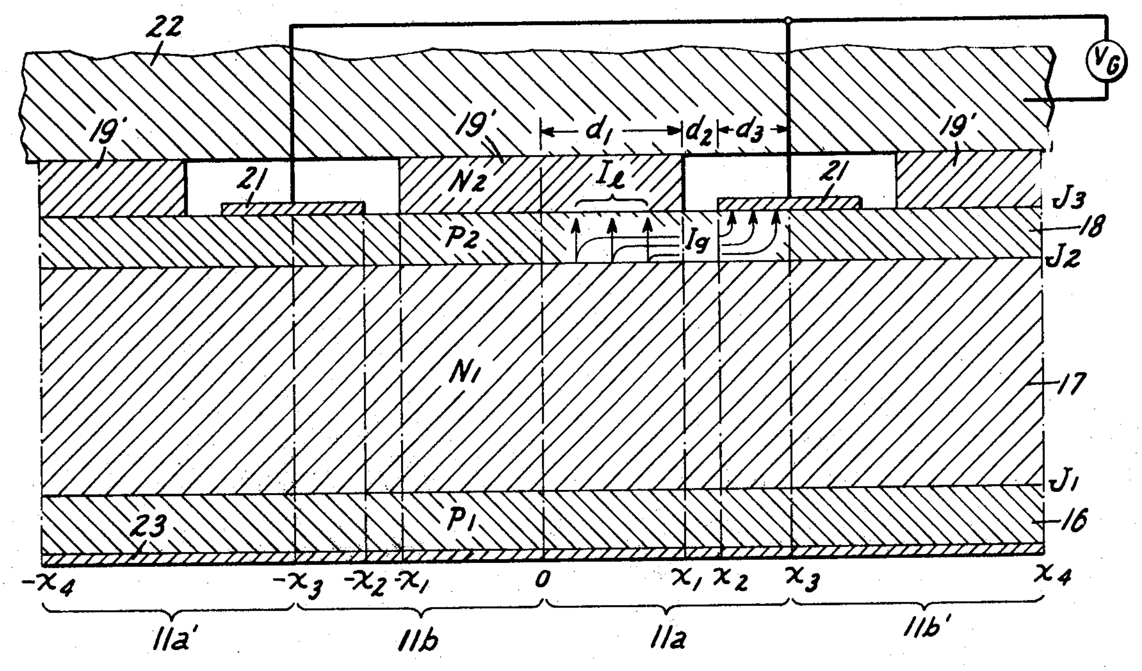
FIG. 2 is a diagrammatic cross-sectional view of a PNPN gate turnoff thyristor with an interdigitated emitter-gate construction, this view also being typical of a cross section of a device with interdigitation in the form of an involute as shown in FIG. 5.
Figure 10:
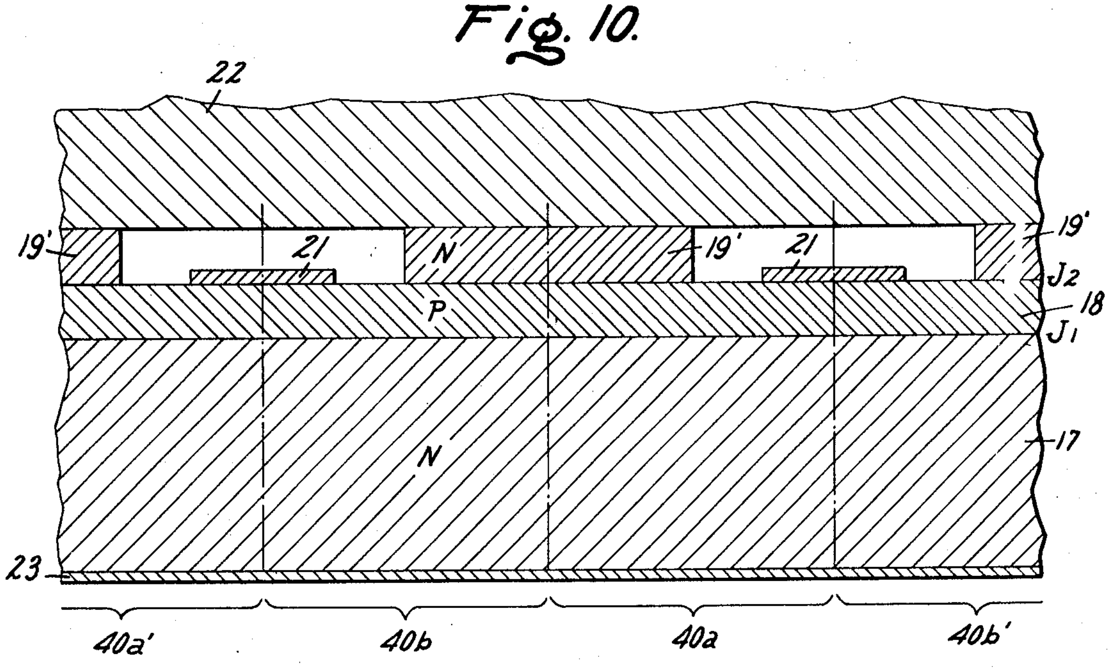

FIG. 10 is a diagrammatic cross-sectional view similar to FIG. 2 of an NPN power transistor with an interdigitated emitter-base construction.

The gate turnoff thyristor 15 shown in FIG. 1 is a unidirectional triode thyristor with a four-layer semiconductor structure which is also turned on by a gate control signal. Device 15 is preferably a silicon gate turnoff thyristor with a PNPN semiconductor configuration, although such devices are also made with an NPNP structure and of semiconductor materials other than silicon, such as germanium. The outer P1-layer 16 connected to anode terminal A is known as the anode or collector layer, while the other outer-N2-layer 19 connected to cathode terminal C is known as the cathode or emitter layer. Inner N-1 and P2-layers 17 and 18 are the gate or base layers. Gate terminal G is connected to the gate layer 18, and a gating turn on and turnoff circuit 20 is connected between gate terminal G and cathode terminal C. Assuming that the anode terminal potential is positive with respect to the cathode terminal, the application of a positive gating pulse to terminal G by gating circuit 20 switches the device from its high impedance blocking state and renders the device conductive for the flow of load current $I_L$ through the device. To switch from the low impedance conducting state back to the high impedance blocking condition, a negative turnoff pulse is applied to gate terminal G by gating circuit 20, resulting in the withdrawal of gate current $I_G$ from gate layer 18 and setting stage for rendering the device nonconductive. The gate turnoff thyristor has utility as a solid-state switch in both direct current and alternating current circuits, and when used with an alternating current supply voltage is additionally line commutated off, as is the ordinary thyristor, at the natural current zero or by the change of polarity of the line voltage.

Although the invention is independent of the relative width and resistivity of the four semiconductor layers 16–19, for the purposes of explanation it will be assumed that N1-gate layer 17 has a substantially greater width and resistivity than the other layers. Further, P2-gate layer 18 has a resistivity several magnitudes greater than the N2-emitter layer 19. In the reverse voltage direction, with cathode terminal C more positive than anode terminal A, the burden of voltage blocking falls on junction J1 between P1-layer 16 and N1-layer 17. Depletion regions form on both sides of junction J1, however in view of the high gate resistivity ratio of the N1-layer with respect to the P1-layer, the depletion layer thickness and the voltage held by the P1-layer are negligibly small by comparison to the depletion layer thickness and voltage held by the N1-layer. Junction J3 between P2-layer 18 and N2-layer 19 contributes only a small amount to the voltage blocking capability because of the high conductivity of P2-layer 18. In the forward voltage direction, with anode terminal A more positive than cathode terminal C, junction J2 between N1-layer 17 and P2-layer 18 provides the forward breakover voltage capability until such time as the device is rendered conductive by the injection of a positive gate current pulse into the P2-gate layer 18. Once rendered conductive, the gate current pulse can be removed and the device remains conducting, as does the ordinary thyristor. With the device 15 in its low impedance conduction condition, a forward voltage or forward e.m.f. (electromotive force) is developed across the center junction J2. Turnoff of the device is accomplished by reversing the center junction voltage from the forward to the counter e.m.f. direction. This voltage reversal is accomplished in two stages, first, the reduction of the forward e.m.f. to zero, and second, the buildup of the counter e.m.f. The theory underlining these mechanisms is further explained in the inventor's publication entitled "Introduction to Turnoff Silicon-Controlled Rectifiers," AIEE Transactions on communication and Electrons, July 1963, pps. 375–383. The reduction of the forward e.m.f. to zero, thereby setting the stage for load current turnoff, is accomplished by withdrawing the negative gate current $I_G$ from gate terminal G. In order to permit the quick removal of accumulated charge carriers by extraction from the entire area of center junction J2, it is necessary to use an interdigitated emitter-gate structure, i.e., between P2-layer 18 and N2-layer 19. The quick removal of carriers by extraction facilitates a high recovery speed, and hence high-frequency operation of the device, since otherwise the carriers vanish by the slower process of recombination. The negative gate voltage used to extract the accumulated carriers, however, must be relatively modest because junction J3 will not sustain a large gate voltage $V_G$. For junction J3 the reverse breakdown voltage in the typical gate turnoff thyristor used for the purposes of explanation is typically about 10–20 volts. Therefore, the gate voltage $V_G$ must be less than that. A modest gate voltage is further desirable to reduce the required gate power. Once the gate turnoff thyristor has been turned off, the negative gate current is no longer needed to maintain the high impedance blocking condition.

FIG. 2 shows a typical cross section of a gate turnoff thyristor with an interdigitated emitter-gate configuration. The P1-anode layer 16, the N1-gate layer 17, and the P2-gate layer 18 are coextensive with one another and extend across the entire width of the device structure. A plurality of spaced, alternating emitter (cathode) elements 19' and gate (base) contact elements 21' are formed or deposited on P2-gate layer 18. The interdigitated emitter elements 19' and gate contact elements 21 are assumed to be in the prior art rectilinear arrangement, and thus extend perpendicular to the plane of the paper and appear from above as a series of spaced stripes or bands. All of the emitter elements 19' are connected together by a cathode pressure plate 22, or in some equivalent manner such as by filling in the spaces with silicon dioxide and depositing contact metallization upon the flush N2-element surfaces. The individual gate contact elements 21 are also connected together in parallel circuit relationship, as is indicated here diagrammatically by the connecting leads coupled to the source of gate voltage $V_G$. Suitable contact is also made to the P1-layer 16, as by deposition of a layer of contact metallization 23 made for instance of silver or aluminum. Gate contact metallizations 21 can be made of the same metals.

In the interdigitated geometry, a unit gate turnoff device is considered to extend from the center of an emitter element 19' to the center of an adjacent gate contact element 21. With reference to the abscissa coordinate system shown in FIG. 2, unit thyristor **11*a* extends between 0 and $x_3$, while the image unit thyristor 11*b*, which shares the central emitter element 19', extends between 0 and $-x_3$. Unit thyristor 11*a*', which shares a gate contact element 21 with unit thyristor 11*b* but is identical in structure to unit thyristor 11*a*, extends from $-x_3$ to $-x_4$, and unit thyristor 11*b*' extends between $x_3$ and $x_4$. It is seen that the pattern shown between $-x_3$ and $x_3$ is repeated laterally, and is referred to as interdigitation. The total load current $I_L$ flows at right angles to the wafer junctions, and divides equally among the unit thyristors, each conducting a unit load current $I_l$. Referring to unit thyristor 11*a* for the purposes of discussion, within each unit thyristor the unit load current $I_l$ has a constant current density as it flows from P2-gate layer 18 into an emitter unit or half element 19', as is indicated by the equal arrows. The negative unit gate turnoff current $I_g$ in P2-gate layer 18 flows laterally under the emitter unit element 19' and enters the adjacent gate contact unit or half element 21. As has been mentioned, the gate voltage $V_G$ for turnoff is negative with respect to the cathode. Thus, the P2-gate layer 18** is most negative at abscissa coordinate $x_3$ and becomes less negative as $x$ approaches 0.

In order to achieve complete turnoff of the entire cross section of the conduction area at center junction J2, the gate voltage $V_G$ must remove the accumulated charge carriers from the entire conduction area, thereby setting the stage for load current turnoff. The turnoff gate voltage depends in general on the magnitude of the turnoff gate current, the sheet resistance of P2-gate layer 18, and the geometry of the emitter-gate interdigitation. As was previously stated, P2-gate layer 18 is most negative at $x_3$ and becomes less negative as $x$ approaches 0. The lateral gate resistance through which the gate voltage $V_G$ must act in order to extract the turnoff gate current $I_g$ can be divided into two parts, namely, the lateral gate resistance between 0 and $x_1$, and between $x_1$ and $x_3$. Knowing the required turnoff gate current $I_g$ and the calculated lateral gate resistance, the required negative gate voltage $V_G$ is determined on the basis of Ohm's law considerations. For that portion of the P2-gate layer 18 that is under half of emitter element 19', the most negative voltage is at $x_1$ and the restoration of the blocking of center junction J2 begins in this vicinity. During the process of load current turnoff, the load current filaments retreat toward $x=0$, resulting in an inward sweep of junction blocking. During this retreat, the load current density increases and so does the forward voltage drop of the thyristor, resulting in a reduction of the magnitude of the load current. This process continues until load current flow ceases. It can be shown by known techniques that the gate voltage required to extract the accumulated charge carriers between 0 and $x_1$ is proportional to the sheet resistance of the semiconductor material of P2-gate layer 18 and to the load current density, is proportional to the square of the distance $d_1$ under the emitter half element 19', and inversely proportional to the gate current turnoff gain, where the gate current turnoff gain is the ratio I $/I_g$. The important thing to note here is that the required gate voltage for the distance $d_1$ under the emitter half element 19' is proportional to the square of the distance $d_1$. This indicates the effectiveness of interdigitation for the purpose of reducing the lateral gate resistance. Thus, an interdigitated emitter-gate structure is essential in a larger gate turnoff thyristor handling larger load currents. The total required gate voltage also includes the gate voltage required to extract the carriers between $x_1$ and $x_3$. This portion of the gate voltage can be shown to be proportional to the sheet resistance, the load current density, the product $d_1$ ($d_2$+½$d_3$), and inversely proportional to the gate current turnoff gain. In calculating the total required gate voltage for a particular model thyristor, it can be assumed that the lateral gate resistance is somewhat reduced by conductivity modulation. Furthermore, turnoff is more difficult at elevated temperatures than at normal room temperatures, because the lateral gate resistance increased with temperature, and in addition, the current gains decrease in temperature, both leading to a smaller gate carrying turnoff gain. Actually, the gate current and gate voltage should be larger than the values obtained when calculating in this matter in order to avoid excessive turnoff losses and also to obtain high recovery speed.

When turning off the thyristor, the load current retreats from the edge of the emitter element or stripe 19' towards its interior. In doing so, the current density increases and so does the heat generation per unit area under the emitter element. As previously pointed out, thyristor turnoff becomes difficult at increased temperatures, and in fact, if the temperature rises too high, the turnoff may become altogether impossible. Such a condition may arise if the gate sheet resistance is not uniform whereby the load current density becomes excessive in spots. Similarly, a configuration where the edges of gate contact metallizations 21 are not equidistant from the edges and centerlines of the emitter elements 19' may cause nonuniformities of load current density with subsequent failure to turn off. In view of this specific problem with gate turnoff thyristors, the distance over which the excess carriers are removed from the emitter to the gate should be constant. Further, to keep the turnoff gate voltage low, the length-to-width ratio of the elements should be large.

Figure 3:
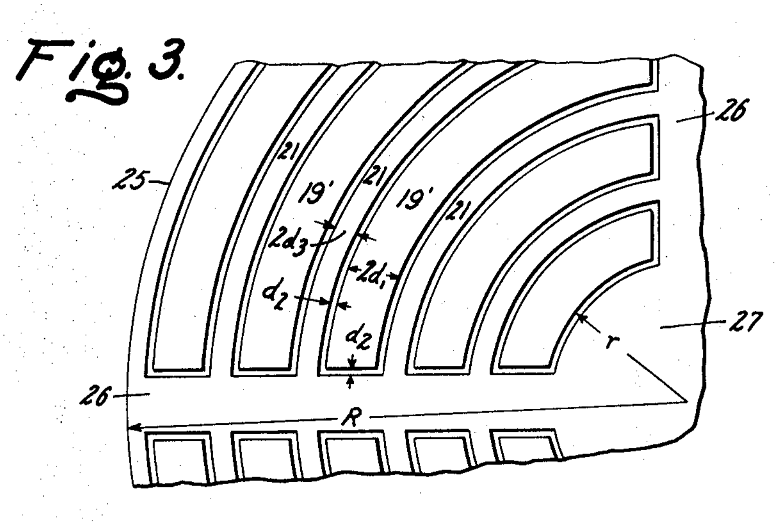
FIG. 3 is a partial plan view of an interdigitated emitter-gate configuration using quadrants of a circle, and is included to show pictorially the greater semiconductor wafer utilization obtained by using an involute arrangement.

When a rectilinearly interdigitated gate turnoff thyristor structure is formed on a circular semiconductor wafer, however, it has the disadvantage of not fully utilizing the wafer area. Since there is less conduction than junction area, the load current rating is limited. This drawback can be reduced by giving the interdigitated emitter-gate configuration a circular pattern such as shown in FIG. 3. The semiconductor wafer 25 has a radius R, and the inner limit of the interdigitated structure is a circle with radius *r*. The interdigitated emitter elements 19' and gate contact elements 21 are formed as concentric stripes or bands and are divided into four quadrants by four radially positioned buses 26 that conduct the gate current to the center 27 of the wafer within radius *r*, at which position a gate lead makes contact to the device. Gate contact elements 21, the radial buses 26, and the central area 27 are all electrically connected by a continuous metallization. Emitter elements 19' have a width $2d_1$, the gate contact elements 21 have a width $2d_3$, and the spacings between gate and emitter edges is $d_2$. In addition to not fully utilizing the area of the wafer, the concentric circle interdigitation pattern shown in FIG. 3 has the additional disadvantage that the various emitter elements 19' and gate contact elements 21 are not identical to one another. For simultaneous turnoff of the central junction area (J2) all emitter elements must be identical or substantially identical and the corresponding gate contact elements must be identical or substantially identical. If the structures are identical only with respect to resistance but not with inductance, an unequal inductance causes skin effect, and results in a nonuniform turnoff of the center junction.

In accordance with the invention, the emitter-gate structure on a circular semiconductor wafer is interdigitated in the form of an involute. This has the advantage of maximum or optimum utilization of the wafer area, and hence a higher current rating for a circular wafer becomes possible. The constant-width emitter elements and gate contact elements formed in the involute shape facilitate complete turnoff and also facilitate the fabrication of a device since the same curve is repeated over and over resulting in simplification of the mask pattern. The geometry of the involute curve will be explained with regard to the FIG. 4 sketch, in which the involute of a circle is shown, the circle being known as the evolute. Assume that one end of a string is fastened to the the circumference of the circle 28 with the radius *r*, and wound clockwise around the circumference of the circle until its end point reached point Y. As the string is unwound under tension, the end point of the string traces the curve 29, which is the involute of the circle 28. The normals 31–33 to the involute 29 are all tangent to the circle with radius *r*,i.e., the evolute. If a second involute 30 is traced using the point Z as the starting point to unwind the string, its normals are always shorter than the normals of the first involute curve 29 by a fixed amount equal to the length of arc between points Y and Z. Thus, any two involutes of the same evolute curve are equidistant from one another. Therefore, the width of the band or stripe bounded by the two involute curves 29 and 30 is constant, and the involutes drawn from any other point on circle 28 have the same identical shape. By winding the string around the circle 28 in the opposite direction and unwinding clockwise rather than counterclockwise, the involute curve 34 that is generated starting at point Y is the mirror image of the involute 29 and is oppositedly sloped. As the length of the involutes increases, all the involutes tend to approximate a circle. The evolute from which the parallel involute curves are derived can take other shapes than a circle, such as a square.

FIG. 5 shows the preferred embodiment of the invention in which the emitter-gate structure is interdigitated in the form of an involute. The evolute of the parallel involute curves defining the edges of the alternating, spaced emitter stripes 19' and gate contact stripes 21 is preferably a circle, such as the circle 28', but can be any suitable plane curve. With this interdigitated structure geometry, all of the emitter elements 19' are identical to one another, as are the gate contact elements 21. It is seen that the semiconductor cross-sectional view of FIG. 2, originally drawn and explained with relation to a rectilinear emitter-gate interdigitation, is also a cross section of the involute-shaped emitter-gate interdigitated structure taken along any one of the normals (see lines 31–33 in FIG. 4) to the involute curves. The involute configuration advantageously offers a large length-to-width ratio of the emitter and gate contact stripes, as is seen from the equation below. The formula for the length of an individual involute curve in FIG. 5 is $$l=\frac{r}{2}\left[\left(\frac{R}{r}\right)^2-1\right]$$

The outstanding advantage of the involute interdigitated structure, however, is that this geometry achieves maximum or optimum utilization of the area of the circular semiconductor wafer 25. As in FIG. 3, the central circular area 27 is covered with a metallization that is continuous with the metallizations of gate contact elements 21, and this central area is used to make contact to the gate lead. Assuming that the radii R, *r*, and the stripe dimensions $d_1$, $d_2$, and $d_3$ are the same in FIG. 3 and FIG. 5, there is a significant increase in the total emitter area achieved by eliminating the radial gate current buses 26 in the concentric stripe configuration of FIG. 3. As a consequence of the involute configuration, there is more conduction junction area and a larger load current rating is obtained. A significant advantage in the fabrication process is the simpler mask making due to the repetition of one and the same curve. These masks are used at a number of steps in the semiconductor fabrication, such as for photoeteching or for diffusion of selected areas of the wafer. Additionally, the involute construction permits the emitter stripes 19' and gate contact stripes 21 to have different widths.

The intersection of the end portion of emitter stripes 19' with the periphery of circular semiconductor wafer 25 may require modification of the shape of the ends of the emitter stripes. At the point 35 at which the edge of the adjacent gate contact element 21 intersects the circumference of wafer 25, the unit thyristor including half of the adjacent emitter element is thereafter incomplete because there is no adjacent gate contact for the extraction of gate turnoff current. Accordingly, the emitter half element is preferably terminated at a line 36 normal to the involute curves at the point 35. The approximately triangular area 37 takes no part or only a small part in the conduction process, but the amount of lost emitter area is small. In some cases, the removal of emitter area 37 is not necessary since complete or absolute identity between the several emitter elements 19' and gate contact elements 21 is not required. Approximate identity between the respective emitter elements and gate contact elements is sufficient to practice the invention.

FIGS. 6, 7, and 8 illustrate modifications of the preferred involute interdigitation pattern of FIG. 5. In FIG. 6, the evolute of the curves bounding the emitter stripes 19' and gate contact stripes 21 is the circle 28' with radius *r*, the same as in FIG. 5. However, the involute interdigitated structure begins at the circle 28'', which has a radius *r'* greater than *r*. Consequently, the central area 27' is larger than the similar area 27 in FIG. 5. Instead of making contact to the gate lead in this location, a ring-shaped gate contact area 38 is provided at the periphery of wafer 25. The ring-shaped gate contact area 38 is coated with deposited contact metallization that is continuous with the metallizations forming gate contact elements 21. In FIG. 7, the involute interdigitated structure originates at the evolute circle 28', the same as in FIG. 5, but the ring-shaped gate contact area 38' is located at the center of the portion of wafer 25 covered with the interdigitated structure, centered between the radii R and *r*. Alternatively, of course, central area 27 in FIG. 7 can also be covered with gate contact metallization, and a similar modification can be made with regard to metallizing central area 27' in FIG. 6.

The modification made in FIG. 8 is that the involute curves defining the geometry of the interdigitated structure have both the positive and the negative slope. In FIG. 4 it was pointed out that involutes 29 and 34, although both originating at Y, have opposite slopes. Involute 29 is traced by the end of the string as it is unwound from the circumference of evolute 28 in a counterclockwise direction, whereas involute 34 is traced by the end of a string wound in the opposite direction on evolute 28 and then unwound in a clockwise direction. In FIG. 8, the evolute of both the positive and negative slope involutes is the circle 28' and the centrally located gate contact ring 38' is used, as in FIG. 7. The central area 27 within evolute 28' is either covered with contact metallization or not, as desired. Between the evolute circle 28' and gate contact ring 38', the interdigitated emitter and gate contact stripes 19' and 21 have the same pattern as in FIG. 5, but have the opposite slope between gate contact ring 28' and the circumference of wafer 25. The oppositely sloped involute interdigitated structures are, in a sense, mirror images of one another.

The involute interdigitation of emitter and gate (or base) layers is applicable to other power semiconductor devices such as the power transistor. The two-transistor analogy of the thyrister is well known. Alternatively, an NPN transistor may be thought of as a PNPN thyristor minus the outside P-layer, which acts as a trigger for the transistor. The same relation applies to the PNP transistor and the NPNP thyristor. In a power transistor, however, simultaneous turn on of all portions of the conduction junction area is needed to maximize the efficiency of the device. In contrast with the gate turnoff thyristor, there is no problem in achieving complete turnoff of the device by removing the base drive current. Comparing FIG. 9 with FIG. 1, the power transistor 40 comprises only the three NPN layers 17, 18, and 19, and the two load terminals are the emitter terminal E and the collector terminal C. The base terminal B is connected to P-layer 18 and the base drive circuit 41 connected between terminals B and E supplies base current $I_B$ to effect turn on of the transistor. Furthermore, by reducing the lateral gate resistance the high-frequency response of the transistor is improved.

Transistor 40 is fabricated on a circular semiconductor wafer using any of the involute-shaped interdigitated emitter-base structures shown in FIGS. 5–8. A cross section similar to FIG. 2 illustrating the transistor interdigitation configuration is shown in FIG. 10, taken at the same place as the 2—2 section line in FIG. 5, assuming that the semiconductor wafer has only three layers instead of four. FIG. 10 is identical to FIG. 2 with the exception that the second P-layer (P1-layer 16) is not included in this structure. In transistor terminology, N-layer 17 is the collector layer, P-layer 18 is the base layer, and the interdigitated elements 21 are known as the base contact elements or stripes. The four unit transistors identified by the numerals 40*a*, 40*b*, 40*a'*, and 40*b'* are illustrated. The involute emitter-base interdigitated structure provides simultaneous turn on of the entire area of the base-collector junction J1 for the same reasons as simultaneous turnoff in gate turnoff thyristors.

The involute interdigitation construction is also useful in ordinary thyristors, i.e., devices such as a common silicon controlled rectifier that ordinarily require a commutating circuit for commutation, where operation at a higher frequency is desired. The fact that electric charges can be removed from the entire center junction area reduces the stored charge and thereby reduces the turnoff time. For this mode of operation, the added gate turnoff circuit operates simultaneously with the external commutation circuit to switch the device from the conducting to the nonconducting state.

As a specific example of the practice of the invention, the approximate physical parameters for a 1,000-volt, 100-ampere power gate turnoff thyristor are given. The model thyristor has a PNPN structure as shown in FIG. 1, and uses the preferred involute emitter-gate interdigitation pattern shown in FIG. 5. Starting with N1-layer 17, the remaining semiconductor layers are formed on the circular wafer by standard deposition and diffusion processes, using photomasking techniques to delineate the emitter stripes 19' and the gate or base contact stripes 21. In the following table are given the impurity concentrations $N_a$ and $N_d$ (using boron and phosphorus as the activator impurities), the width *w* of each layer, and the resistivity ρ of each layer. The resistivity at both 27° C. and 125° C. is given.

| | | N1 | N2 | P1 | P2 |
|---|---|---|---|---|---|
| $N_a$ | cm.$^{13}$ | | | $9 \cdot 10^{16}$ | $9 \cdot 10^{16}$ |
| $N_d$ | cm.$^{13}$ | $1 \cdot 7 \cdot 10^{14}$ | $10^{20}$ | | |
| $w$ | μm. | 150 | 25 | 50 | 25 |
| ρ (27° C.) | ohm-cm. | 30 | $10^{13}$ | 0.3 | 0.3 |
| ρ (125° C.) | ohm-cm. | 63 | $10^{13}$ | 0.5 | 0.5 |

Referring to FIG. 5, the wafer radius R=9 mm., the evolute circle radius *r*=2.6 mm., the emitter stripe width $2d_1$ =0.8 mm., the gate contact stripe width $2d_3$ =0.4 mm., and the emitter and contact stripe separation $d_2$ =0.1 mm. With these dimensions, the length *l* of the involute curve is 16.8 mm., and the total emitter area is about 135 mm$^2$. Applying the same dimensions to the interdigitated pattern using quadrants of circles as illustrated in FIG. 3, (the width of radial buses 26 is assumed to be 1.0 mm.), the total emitter area is about 119 mm$^2$. By using the involute configuration there is thus an increase of 14 percent in the available emitter area. By calculating the gate turnoff voltage $V_G$ in the manner previously put forth, the required gate turnoff voltage for the design load current density of 100 amps/cm.$^2$ is less than 10 volts. In one theoretical calculation the gate turnoff voltage is 3 volts. At both room temperatures and elevated temperatures, the model thyristor has both forward and reverse voltage capability exceeding the required 1,000 volts.

In summary, an interdigitated emitter-base (gate) layer structure is formed in the shape of an involute on a circular multilayer semiconductor wafer. The involute-shaped interdigitated emitter elements and base (or gate) contact elements are respectively identical to one another, thereby assuring simultaneous turnoff of all portions of the junction area in devices such as the gate turnoff thyristor, and simultaneous turn on in devices such as the transistor. The repeated identical elements further simplifies mask making in the fabrication of the device. The most significant feature of the involute configuration, however, is the higher utilization of the area of a circular wafer. The increased junction area permits higher current ratings, as for example, a 1,000-volt, 100-ampere gate turnoff thyristor that is turned off by a modest gate voltage of less than 10 volts.

While the invention has been particularly shown and described with reference to several preferred embodiments thereof, it will be understood by those skilled in the art that the foregoing and other changes in form and details may be made therein without departing from the spirit and scope of the invention.

What I claim as new and desire to secure by Letters Patent of the United States is:

1. In an interdigitated structure for a semiconductor device having outer semiconductor layers and at least one inner semiconductor layer coupled to a control current terminal, the improvement which comprises
  an inner semiconductor layer of one conductivity type,
  a plurality of elongated interdigitated control current contact elements and outer semiconductor layer elements of the opposite conductivity type respectively having constant widths, wherein all of said elements are involute shaped and formed parallel to one another on one surface of said inner semiconductor layer, and
  contact means for effecting parallel electrical connection of said involute-shaped outer semiconductor layer elements and independent parallel electrical connection of said involute-shaped control current contact elements.

2. A structure as set forth in claim 1 wherein said inner semiconductor layer is circular, and
  the evolute of the involutes defining said involute-shaped control current contact elements and outer semiconductor layer elements is centered at the center of said inner semiconductor layer.

3. A structure as set forth in claim 2 wherein said contact means effecting parallel electrical connection of said control current contact elements is formed on said inner semiconductor layer within the centrally located evolute.

4. A structure as set forth in claim 2 wherein said contact means effecting parallel electrical connection of said control current contact elements is a ring-shaped contact formed on said circular inner semiconductor layer adjacent its periphery.

5. A structure as set forth in claim 2 wherein said contact means effecting parallel electrical connection of said control current contact elements is a ring-shaped contact formed on said circular inner semiconductor layer between its periphery and said evolute.

6. A structure as set forth in claim 5 wherein the involutes on either side of said ring-shaped contact are oppositely sloped.

7. A structure as set forth in claim 1 wherein said inner semiconductor layer is circular, and
  the evolute of the involutes defining said involute-shaped control current contact elements and outer semiconductor layer elements is a circle centered at the center of said inner semiconductor layer.

8. A structure as set forth in claim 7 wherein said involute-shaped control current contact elements and outer semiconductor layer elements have unequal widths, and
  said contact means effecting parallel electrical connection of said control current contact elements is formed on said inner semiconductor layer within said evolute.

9. A structure as set forth in claim 7 wherein the beginning of said involute-shaped control current contact elements and outer semiconductor layer elements is radially outward from said evolute.

10. A power semiconductor device of the type having a base control current terminal comprising
  a circular multilayer semiconductor wafer including a base layer of one conductivity type,
  a plurality of elongated interdigitated base control current contact elements and emitter semiconductor elements of the opposite conductivity type respectively having equal constant widths, wherein said alternating base contact elements and emitter elements are involute-shaped and formed parallel to one another on the surface of said base layer, and
  contact means for effecting parallel electrical connection of said involute-shaped emitter elements and independent parallel electrical connection of said involute-shaped base contact elements.

11. A structure as set forth in claim 10 wherein the evolute of the involutes defining said involute-shaped base contact elements and emitter elements is a circle at the center of said base layer.

12. A structure as set forth in claim 11 wherein the beginning of said involute-shaped base contact elements and emitter elements is at the evolute circle, and
  said contact means effecting parallel electrical connection of said base contact elements if formed on said base layer within the evolute circle.

13. A structure as set forth in claim 12 wherein said semiconductor wafer comprises only a collector layer in addition to said base layer, and
  said semiconductor device is a power transistor.

14. A structure as set forth in claim 12 wherein said semiconductor wafer has two semiconductor layers in addition to said base layer, and
  said semiconductor device is a four-layer power gate turnoff thyristor.

15. A structure as set forth in claim 12 wherein the ends of said involute-shaped emitter elements are reduced in width near the periphery of said circular semiconductor wafer.